United States Patent
Rowell et al.

(10) Patent No.: US 10,554,314 B1
(45) Date of Patent: Feb. 4, 2020

(54) MEASUREMENT SYSTEM AND METHOD FOR MULTIPLE ANTENNA MEASUREMENTS

(71) Applicant: Rohde & Schwarz GmbH & Co. KG, Munich (DE)

(72) Inventors: Corbett Rowell, Munich (DE); Vincent Abadie, Hohenschaeftlarn (DE); Bledar Karajani, Munich (DE); Adrian Cardalda-Garcia, Munich (DE); Jens Wappler, Feldkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/200,102

(22) Filed: Nov. 26, 2018

(51) Int. Cl.
  *H04B 17/10* (2015.01)
  *G01R 29/10* (2006.01)
  *H04B 17/29* (2015.01)
  *H04B 17/14* (2015.01)
  *H01Q 3/26* (2006.01)

(52) U.S. Cl.
  CPC ......... *H04B 17/102* (2015.01); *G01R 29/105* (2013.01); *H01Q 3/267* (2013.01); *H04B 17/14* (2015.01); *H04B 17/29* (2015.01)

(58) Field of Classification Search
  CPC combination set(s) only.
  See application file for complete search history.

(56) References Cited

U.S. PATENT DOCUMENTS

| | | | |
|---|---|---|---|
| 9,906,315 B1* | 2/2018 | Bartko | H04B 17/102 |
| 2008/0020746 A1* | 1/2008 | Alexandar | H04W 24/06 455/423 |
| 2014/0256373 A1* | 9/2014 | Hernandez | H04B 17/12 455/509 |
| 2017/0223559 A1* | 8/2017 | Kong | H04W 24/06 |
| 2017/0279546 A1* | 9/2017 | McGarry | H04B 17/0085 |
| 2017/0373773 A1* | 12/2017 | Jing | H04B 17/318 |
| 2018/0254840 A1* | 9/2018 | Foegelle | H04B 17/13 |
| 2018/0321292 A1* | 11/2018 | Bartko | G01R 29/0821 |
| 2019/0058535 A1* | 2/2019 | Karajani | H04B 17/3911 |

FOREIGN PATENT DOCUMENTS

| | | |
|---|---|---|
| WO | 2018031119 A1 | 2/2018 |
| WO | 2018128950 A2 | 7/2018 |

* cited by examiner

*Primary Examiner* — Junpeng Chen
(74) *Attorney, Agent, or Firm* — Ditthavong & Steiner, P.C.

(57) ABSTRACT

A measurement system for multiple antenna measurements is provided. The measurement system comprises a device under test, at least two measurement antennas, and an anechoic chamber. In this context, the at least two measurement antennas are arranged on at least one wall of the anechoic chamber.

19 Claims, 2 Drawing Sheets

MEASUREMENT SYSTEM AND METHOD FOR MULTIPLE ANTENNA MEASUREMENTS

TECHNICAL FIELD

The invention relates to a measurement system and a measurement method for multiple antenna measurements.

BACKGROUND ART

Generally, in times of an increasing number of applications providing wireless communication capabilities, especially wireless communication capabilities employing multiple antennas, there is a growing need of a measurement system and a measurement method especially for verifying correct functioning of said applications in a highly efficient and accurate manner.

WO 2018/128950 A2 discloses a testing system and method for testing wireless communication devices. Said system and method include an anechoic far field chamber with a dual-axis positioning system for rotating the device under test. In addition to this, the testing system further includes a measuring antenna and a number of link antennas distributed throughout the testing system. As it can be seen, due to the spatial distribution of the antennas with respect to the test chamber, which leads to an increased mechanical complexity, and thus an error-prone structure, both said testing system for testing wireless communication devices and the corresponding method can disadvantageously not ensure an efficient and accurate measurement.

Accordingly, there is a need to provide a measurement system and a measurement method for multiple antenna measurements, whereby said measurements can be performed in a highly efficient and accurate manner.

SUMMARY OF THE INVENTION

According to a first aspect of the invention, a measurement system is provided. The measurement system comprises a device under test, at least two measurement antennas, and an anechoic chamber. In this context, the at least two measurement antennas are arranged on at least one wall of the anechoic chamber. Advantageously, complexity, especially mechanical complexity, can be reduced, thereby ensuring a high measurement efficiency and accuracy. Further advantageously, for instance, this allows for less scattering and/or for performing measurements with special respect to a multiple target for an automotive radar. In addition to this, as a further advantage, the at least one wall may preferably comprise a bottom wall, a side wall, or a top wall.

According to a first preferred implementation form of the first aspect of the invention, at least one, preferably each, of the at least two measurement antennas is a feed antenna. In addition to this or as an alternative, the anechoic chamber is a shielded anechoic chamber.

Advantageously, measurement efficiency and measurement accuracy can further be increased.

According to a second preferred implementation form of the first aspect of the invention, the anechoic chamber is of cuboid shape or is substantially cuboid shaped.

Advantageously, complexity can further be reduced, which leads to an increased efficiency.

According to a further preferred implementation form of the first aspect of the invention, each of the at least two measurement antennas is oriented towards the device under test. Advantageously, for instance, measurement efficiency can further be increased.

According to a further preferred implementation form of the first aspect of the invention, at least one, preferably all but one, of the at least two measurement antennas comprises a signal amplitude controller.

Advantageously, for example, this allows for an increased measurement accuracy. Further advantageously, especially in the case that all but one of the at least two measurement antennas comprise a signal amplitude controller, the remaining measurement antenna may preferably be configured to provide a reference signal.

According to a further preferred implementation form of the first aspect of the invention, the signal amplitude controller is configured to adjust the signal output power of the respective measurement antenna such that the device under test receives the same power from every measurement antenna. Advantageously, measurement efficiency and measurement accuracy can further be increased.

According to a further preferred implementation form of the first aspect of the invention, the signal amplitude controller comprises an attenuator. Advantageously, with respect to a measurement antenna with a shorter distance to the device under test, the respective difference may be compensated with the aid of the attenuator.

According to a further preferred implementation form of the first aspect of the invention, the measurement system further comprises at least one rail. In this context, the at least one rail is tangentially arranged with respect to the at least one wall of the anechoic chamber. In addition to this, the at least two measurement antennas are arranged on the at least one rail. Advantageously, complexity can further be reduced, thereby increasing measurement efficiency and accuracy.

According to a further preferred implementation form of the first aspect of the invention, at least one, preferably each, of the at least one rail is a linear rail.

According to a further preferred implementation form of the first aspect of the invention, at least one, preferably each, of the at least two measurement antennas is movable along the at least one rail in a manual or an automated manner especially in order to change an angular separation between the at least two measurement antennas. Advantageously, doppler effects can be simulated in a highly efficient and accurate manner. Further advantageously, hand-over scenarios can efficiently be simulated. With respect to said hand-over scenarios, it might be particularly advantageous if the device under test is moveable.

According to a further preferred implementation form of the first aspect of the invention, at least two of the at least two measurement antennas are active at the same time especially in order to simulate at least two base stations. Advantageously, for instance, measurements with respect to radio resource management can efficiently and accurately be performed.

According to a further preferred implementation form of the first aspect of the invention, the measurement system further comprises a multiple-axis positioner, preferably a three-axis positioner, configured to position the device under test especially in order to accommodate over-the-air signals from multiple different directions, preferably from at least one horizontal direction and/or from at least one vertical direction. Advantageously, not only measurement efficiency but also measurement accuracy can further be increased.

According to a further preferred implementation form of the first aspect of the invention, the multiple-axis positioner is based on a rotation-swing-rotation structure or on a swing-rotation-swing structure. Advantageously, complexity can further be reduced, which leads to an increased efficiency.

According to a further preferred implementation form of the first aspect of the invention, the measurement system further comprises a measurement equipment connected to at least one, preferably connected to each, of the at least two measurement antennas. In this context, the measurement equipment is configured to perform an analysis with respect to at least one, preferably with respect to each, of the at least two measurement antennas. Advantageously, said analysis may preferably comprise at least one of generating a test signal, receiving a signal from at least one of the at least two measurement antennas, or investigating the respective received signal.

According to a second aspect of the invention, a measurement method is provided. The measurement method comprises the steps of providing an anechoic chamber with a device under test, and arranging at least two measurement antennas on at least one wall of the anechoic chamber. Advantageously, complexity, especially mechanical complexity, can be reduced, thereby ensuring a high measurement efficiency and accuracy. Further advantageously, for instance, this allows for less scattering and/or for performing measurements with special respect to a multiple target for an automotive radar. In addition to this, as a further advantage, the at least one wall may preferably comprise a bottom wall, a side wall, or a top wall.

According to a first preferred implementation form of the second aspect of the invention, at least one, preferably each, of the at least two measurement antennas is a feed antenna. In addition to this or as an alternative, the anechoic chamber is a shielded anechoic chamber. Further additionally or further alternatively, the anechoic chamber is of cuboid shape or is substantially cuboid shaped. Advantageously, measurement efficiency and measurement accuracy can further be increased. Further advantageously, complexity can further be reduced, which also leads to an increased efficiency.

According to a second preferred implementation form of the second aspect of the invention, the measurement method further comprises the step of orienting each of the at least two measurement antennas towards the device under test. Advantageously, for instance, measurement efficiency can further be increased.

According to a further preferred implementation form of the second aspect of the invention, the measurement method further comprises the steps of equipping at least one, preferably all but one, of the at least two measurement antennas with a signal amplitude controller, and adjusting the signal output power of the respective measurement antenna such that the device under test receives the same power from every measurement antenna. Advantageously, for example, this allows for an increased measurement accuracy. Further advantageously, especially in the case that all but one of the at least two measurement antennas comprise a signal amplitude controller, the remaining measurement antenna may preferably be configured to provide a reference signal.

According to a further preferred implementation form of the second aspect of the invention, the measurement method further comprises the steps of tangentially arranging at least one rail with respect to the at least one wall of the anechoic chamber, and arranging the at least two measurement antennas on the at least one rail. Advantageously, complexity can further be reduced, thereby increasing measurement efficiency and accuracy.

According to a further preferred implementation form of the second aspect of the invention, the measurement method further comprises the step of moving at least one, preferably each, of the at least two measurement antennas along the at least one rail in a manual or an automated manner especially in order to change an angular separation between the at least two measurement antennas. Advantageously, doppler effects can be simulated in a highly efficient and accurate manner. Further advantageously, hand-over scenarios can efficiently be simulated. With respect to said hand-over scenarios, it might be particularly advantageous if the device under test is moveable.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
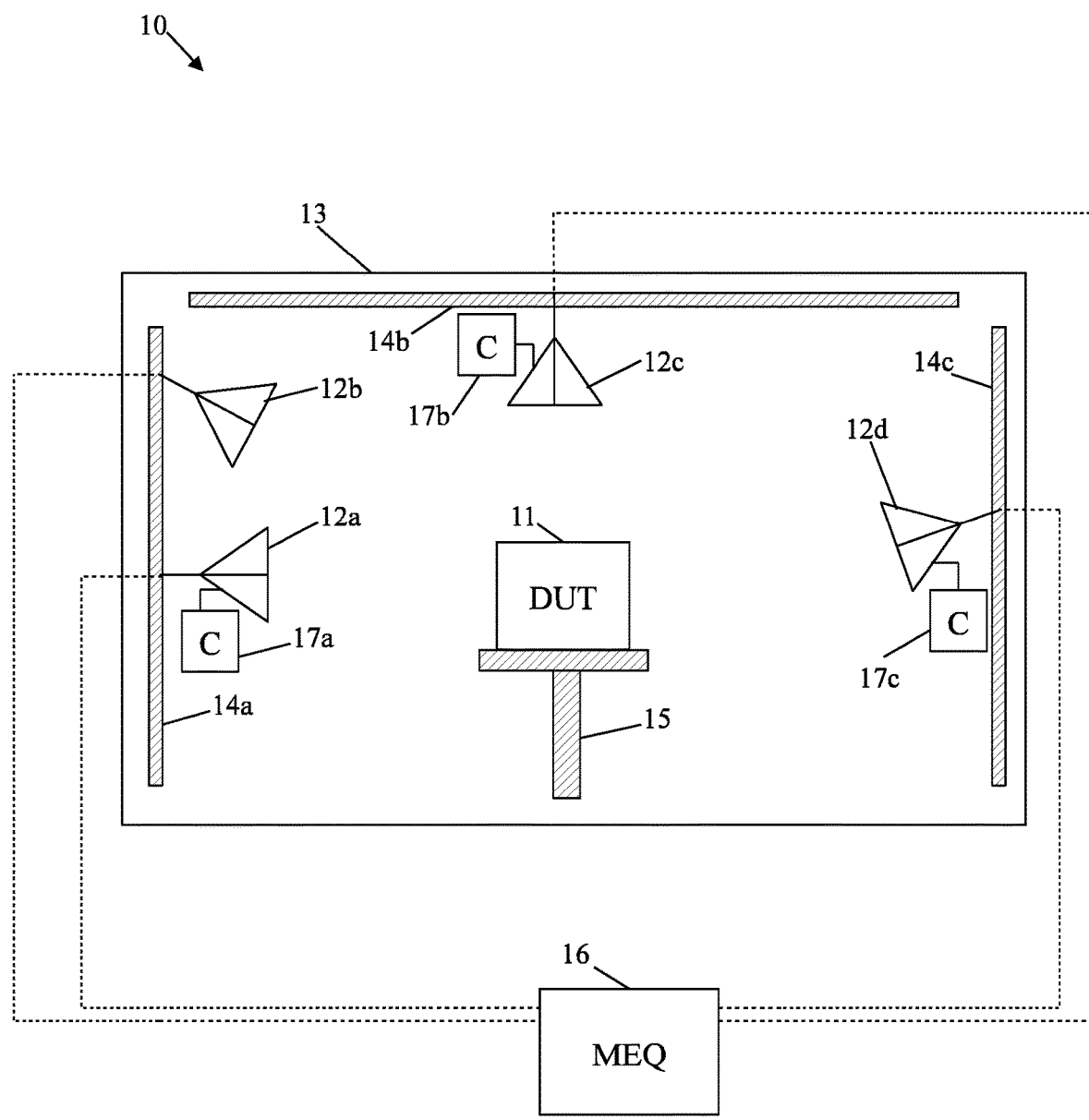
FIG. 1 shows an exemplary embodiment of the first aspect of the invention.

Firstly, FIG. 1 depicts an exemplary embodiment of an inventive measurement system 10 for multiple antenna measurement. Said measurement device 10 comprises a device under test 11, at least two measurement antennas, exemplarily four measurement antennas 12a, 12b, 12c, 12d, an anechoic chamber 13, at least one linear, exemplarily three linear rails 14a, 14b, 14c, a multiple-axis positioner 15 for positioning the device under test 11, and a measurement equipment 16.

In this exemplary case, it is noted that each of the measurement antennas 12a, 12b, 12c, 12d is a feed antenna. In addition to this, the anechoic chamber 13 is a shielded anechoic chamber. Further additionally, as it can be seen, the anechoic chamber 13 is of cuboid shape.

Furthermore, again with respect to the measurement antennas 12a, 12b, 12c, 12d, each of the measurement antennas 12a, 12b, 12c, 12d is oriented towards the device under test 11.

Moreover, as it can further be seen from FIG. 1 all but one of the measurement antennas 12a, 12b, 12c, 12d, exemplarily the measurement antennas 12a, 12c, 12d, comprises a signal amplitude controller 17a, 17b, 17c.

In this context, each of the three signal amplitude controllers 17a, 17b, 17c adjusts the signal output power of the respective measurement antenna 12a, 12c, 12d such that the device under test 11 receives the same power from every measurement antenna.

With respect to this exemplary embodiment, it should be mentioned that the measurement antenna 12b without a signal amplitude controller may preferably provide a reference signal.

Furthermore, with respect to signal amplitude controllers 17a, 17b, 17c, it is noted that at least one of said signal amplitude controllers 17a, 17b, 17c may preferably comprise an attenuator. Advantageously, with respect to a measurement antenna with a shorter distance to the device under test 11, the respective difference may be compensated with the aid of the attenuator. Further advantageously, in general, the distances between the device under test and at least two of the at least two measurement antennas are different. In other words, with respect to this exemplary case, the distances between the device under test 11 and at least two of the four measurement antennas 12a, 12b, 12c, 12d are different.

With respect to the three linear rails 14a, 14b, 14c, it should be mentioned that the each of the rails 14a and 14c is tangentially arranged with respect to two different side walls of the anechoic chamber 13, whereas the rail 14b is tangentially arranged with respect to the top wall of the anechoic chamber 13.

In this context, the measurement antennas 12a and 12b are arranged on the rail 14a, whereas the measurement antenna 12c is arranged on the rail 14b. In addition to this, the measurement antenna 12d is arranged on the rail 14c.

It is further noted that each of the measurement antennas 12a, 12b, 12c, 12d is movable along the respective one of the rails 17a, 17b, 17c in a manual manner especially in order to change an angular separation between the at least two measurement antennas.

As an alternative thereto, each of the measurement antennas 12a, 12b, 12c, 12d may preferably be movable along the respective one of the rails 17a, 17b, 17c in an automated manner especially in order to change an angular separation between the at least two measurement antennas.

Moreover, it might be particularly advantageous if at least two of the measurement antennas 12a, 12b, 12c, 12d are active at the same time especially in order to simulate at least two base stations.

With respect to the multiple-axis positioner 15, it should be mentioned that the multiple-axis positioner 15 especially is a three-axis positioner, which positions the device under test 11 especially in order to accommodate over-the-air signals from multiple different directions, preferably from at least one horizontal direction and/or from at least one vertical direction.

In this context, it might be particularly advantageous if the three-axis positioner is based on a rotation-swing-rotation structure or on a swing-rotation-swing structure. Further advantageously, with respect to the rotation-swing-rotation structure, the at least one respective swivel angle may preferably be between 0 and 180 degrees. Alternatively, with respect to the swing-rotation-swing structure, at least one, preferably each, of the at least two respective swivel angles may especially be between 0 and 180 degrees.

Furthermore, with respect to the measurement equipment 16, it is noted that the measurement equipment 16 is exemplarily connected to each of the measurement antennas 12a, 12b, 12c, 12d.

In addition to this, the measurement equipment 16 performs an analysis with respect to each of the measurement antennas 12a, 12b, 12c, 12d.

In this context, the measurement equipment 16 may preferably generate a test signal for the respective measurement antenna which transmits said test signal to the device under test 11 in a wireless manner. In addition to this or as an alternative, the measurement equipment 16 may preferably receive the respective response of the device under test 11 with the aid of said respective measurement antenna. Further additionally or further alternatively, the measurement equipment 16 may preferably investigate said respective response.

Figure 2:
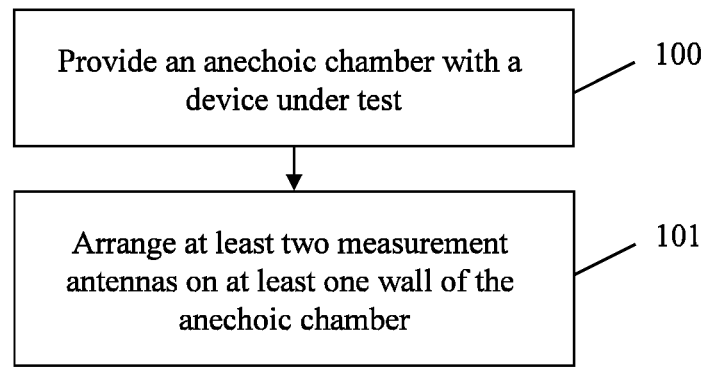
FIG. 2 shows a flow chart of an exemplary embodiment of the second aspect of the invention.

Finally, FIG. 2 shows a flow chart of an exemplary embodiment of the inventive measurement method for multiple antenna measurements. In a first step 100, an anechoic chamber with a device under test is provided. Then, in a second step 101, at least two measurement antennas are arranged on at least one wall of the anechoic chamber.

In this context, it is noted that at least one, preferably each, of the at least two measurement antennas may especially be a feed antenna. In addition to this or as an alternative, the anechoic chamber may preferably be a shielded anechoic chamber. Further additionally or further alternatively, the anechoic chamber may preferably be of cuboid shape or is substantially cuboid shaped.

Furthermore, the measurement method may preferably comprise the step of orienting each of the at least two measurement antennas towards the device under test.

Moreover, the measurement method may further comprise the steps of equipping at least one, preferably all but one, of the at least two measurement antennas with a signal amplitude controller, and adjusting the signal output power of the respective measurement antenna such that the device under test receives the same power from every measurement antenna.

With respect to the signal amplitude controller, it is noted that the signal amplitude controller may preferably comprise an attenuator. Advantageously, with respect to a measurement antenna with a shorter distance to the device under test, the respective difference may be compensated with the aid of the attenuator. Further advantageously, the distances between the device under test and at least two of the at least two measurement antennas are different.

It might be particularly advantageous if the measurement method further comprises the steps of tangentially arranging at least one rail with respect to the at least one wall of the anechoic chamber, and arranging the at least two measurement antennas on the at least one rail. Preferably, at least one, preferably each, of the at least one rail may be a linear rail.

Moreover, the measurement method may further comprise the step of moving at least one, preferably each, of the at least two measurement antennas along the at least one rail in a manual or an automated manner especially in order to change an angular separation between the at least two measurement antennas.

With special respect to the measurement antennas, it is noted that the measurement method may further comprise the step of activating at least two of the at least two measurement antennas at the same time especially in order to simulate at least two base stations.

In addition to this or as an alternative, the measurement method may further comprise the step of positioning the device under test with the aid of a multiple-axis positioner, preferably a three-axis positioner, especially in order to accommodate over-the-air signals from multiple different directions, preferably from at least one horizontal direction and/or from at least one vertical direction.

In this context, it might be particularly advantageous if the multiple-axis positioner is based on a rotation-swing-rotation structure or on a swing-rotation-swing structure.

Additionally or alternatively, the measurement method may further comprise the steps of connecting a measurement equipment to at least one, preferably to each, of the at least two measurement antennas, and performing an analysis with respect to at least one, preferably with respect to each, of the at least two measurement antennas with the aid of the measurement equipment. Advantageously, said step of performing the analysis may preferably comprise at least one of generating a test signal, receiving a signal from at least one of the at least two measurement antennas, or investigating the respective received signal.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system for multiple antenna measurements, the measurement system comprising:
 a device under test,
 at least two measurement antennas, and
 an anechoic chamber,
 wherein the at least two measurement antennas are arranged on at least one wall of the anechoic chamber, and
 wherein all but one of the at least two measurement antennas comprise a signal amplitude controller.

2. The measurement system according to claim 1,
 wherein at least one, preferably each, of the at least two measurement antennas is a feed antenna, and/or
 wherein the anechoic chamber is a shielded anechoic chamber.

3. The measurement system according to claim 1,
 wherein the anechoic chamber is of cuboid shape or is substantially cuboid shaped.

4. The measurement system according to claim 1,
 wherein each of the at least two measurement antennas is oriented towards the device under test.

5. The measurement system according to claim 1,
 wherein the signal amplitude controller is configured to adjust the signal output power of the respective measurement antenna such that the device under test receives the same power from every measurement antenna.

6. The measurement system according to claim 1,
 wherein the signal amplitude controller comprises an attenuator.

7. The measurement system according to claim 1,
 wherein the measurement system further comprises at least one rail,
 wherein the at least one rail is tangentially arranged with respect to the at least one wall of the anechoic chamber,
 wherein the at least two measurement antennas are arranged on the at least one rail.

8. The measurement system according to claim 7,
 wherein at least one, preferably each, of the at least one rail is a linear rail.

9. The measurement system according to claim 7,
 wherein at least one, preferably each, of the at least two measurement antennas is movable along the at least one rail in a manual or an automated manner especially in order to change an angular separation between the at least two measurement antennas.

10. The measurement system according to claim 1,
 wherein at least two of the at least two measurement antennas are active at the same time especially in order to simulate at least two base stations.

11. The measurement system according to claim 1,
 wherein the measurement system further comprises a multiple-axis positioner, preferably a three-axis positioner, configured to position the device under test especially in order to accommodate over-the-air signals from multiple different directions, preferably from at least one horizontal direction and/or from at least one vertical direction.

12. The measurement system according to claim 11,
 wherein the multiple-axis positioner is based on a rotation-swing-rotation structure or on a swing-rotation-swing structure.

13. The measurement system according to claim 1,
 wherein the measurement system further comprises a measurement equipment connected to at least one, preferably connected to each, of the at least two measurement antennas,
 wherein the measurement equipment is configured to perform an analysis with respect to at least one, preferably with respect to each, of the at least two measurement antennas.

14. A measurement method for multiple antenna measurements, the measurement method comprising the steps of:
 providing an anechoic chamber with a device under test, and
 arranging at least two measurement antennas on at least one wall of the anechoic chamber,
 wherein all but one of the at least two measurement antennas comprise a signal amplitude controller.

15. The measurement method according to claim 14,
 wherein at least one, preferably each, of the at least two measurement antennas is a feed antenna, and/or
 wherein the anechoic chamber is a shielded anechoic chamber, and/or
 wherein the anechoic chamber is of cuboid shape or is substantially cuboid shaped.

16. The measurement method according to claim 14,
 wherein the measurement method further comprises the step of orienting each of the at least two measurement antennas towards the device under test.

17. The measurement method according to claim 14,
 wherein the measurement method further comprises the steps of:
 equipping at least one, preferably all but one, of the at least two measurement antennas with a signal amplitude controller, and
 adjusting the signal output power of the respective measurement antenna such that the device under test receives the same power from every measurement antenna.

18. The measurement method according to claim 14,
 wherein the measurement method further comprises the steps of:
 tangentially arranging at least one rail with respect to the at least one wall of the anechoic chamber, and
 arranging the at least two measurement antennas on the at least one rail.

19. The measurement method according to claim 18,
 wherein the measurement method further comprises the step of moving at least one, preferably each, of the at least two measurement antennas along the at least one rail in a manual or an automated manner especially in order to change an angular separation between the at least two measurement antennas.

* * * * *